(12) United States Patent
Lee et al.

(10) Patent No.: US 11,127,739 B2
(45) Date of Patent: Sep. 21, 2021

(54) METHODS OF FABRICATING SEMICONDUCTOR DEVICES USING MOS TRANSISTORS WITH NONUNIFORM GATE ELECTRODE STRUCTURES

(71) Applicant: Samsung Electronics Co., Ltd., Suwon-si (KR)

(72) Inventors: Hye-Lan Lee, Hwaseong-si (KR); Sang-Bom Kang, Seoul (KR); Jae-Jung Kim, Suwon-si (KR); Moon-Kyu Park, Hwaseong-si (KR); Jae-Yeol Song, Seoul (KR); June-Hee Lee, Seoul (KR); Yong-Ho Ha, Hwaseong-si (KR); Sang-Jin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/028,272

(22) Filed: Jul. 5, 2018

(65) Prior Publication Data
US 2018/0331100 A1    Nov. 15, 2018

Related U.S. Application Data

(62) Division of application No. 14/312,109, filed on Jun. 23, 2014, now abandoned.

(30) Foreign Application Priority Data

Jun. 24, 2013 (KR) .......................... 10-2013-0072504

(51) Int. Cl.
*H01L 21/8238* (2006.01)
*H01L 27/088* (2006.01)
(Continued)

(52) U.S. Cl.
CPC .... *H01L 27/0886* (2013.01); *H01L 21/82385* (2013.01); *H01L 21/823821* (2013.01);
(Continued)

(58) Field of Classification Search
CPC ....... H01L 21/82345; H01L 21/823456; H01L 21/823842; H01L 21/82385; H01L 29/66871
See application file for complete search history.

(56) References Cited

U.S. PATENT DOCUMENTS

| 7,214,991 B2 | 5/2007 | Yeo et al. |
|---|---|---|
| 8,367,563 B2 | 2/2013 | Yeh et al. |

(Continued)

FOREIGN PATENT DOCUMENTS

| CN | 1507063 | 6/2004 |
|---|---|---|
| CN | 102034758 | 4/2011 |

(Continued)

*Primary Examiner* — Lauren R Bell
(74) *Attorney, Agent, or Firm* — Muir Patent Law, PLLC

(57) ABSTRACT

A semiconductor device includes a substrate and first and second gate electrodes on the substrate. The first gate electrode includes a first gate insulation film having a bottom portion on the substrate and sidewall portions extending from the bottom portion and away from the substrate defining a first trench having a first width and a first functional film filling the first trench. The second gate electrode includes a second gate insulation film having a bottom portion on the substrate and sidewall portions extending from the bottom portion defining a second trench having a second width different from the first width, a second functional film conforming to the second gate insulation film in the second trench and defining a third trench, and a metal region in the third trench. The first width may be less than the second width.

10 Claims, 10 Drawing Sheets

(51) Int. Cl.
    *H01L 29/49*     (2006.01)
    *H01L 29/66*     (2006.01)
    *H01L 21/84*     (2006.01)
    *H01L 27/092*    (2006.01)
    *H01L 27/12*     (2006.01)
    *H01L 29/51*     (2006.01)

(52) U.S. Cl.
    CPC .... *H01L 21/823842* (2013.01); *H01L 21/845* (2013.01); *H01L 27/0924* (2013.01); *H01L 27/1211* (2013.01); *H01L 29/4966* (2013.01); *H01L 29/66545* (2013.01); *H01L 29/517* (2013.01)

(56) References Cited

U.S. PATENT DOCUMENTS

| | | | |
|---|---|---|---|
| 8,658,525 B2 | 2/2014 | Yeh et al. | |
| 9,755,039 B2 | 9/2017 | Tsau | |
| 2005/0233527 A1* | 10/2005 | Brask | H01L 21/823842 438/287 |
| 2006/0071275 A1 | 4/2006 | Brask et al. | |
| 2011/0081774 A1* | 4/2011 | Yeh | H01L 21/823835 438/591 |
| 2012/0018813 A1 | 1/2012 | Holmes et al. | |
| 2012/0094475 A1* | 4/2012 | Tsau | H01L 29/66545 438/589 |
| 2012/0244669 A1 | 9/2012 | Liao et al. | |
| 2013/0005133 A1 | 1/2013 | Lee et al. | |
| 2013/0026578 A1* | 1/2013 | Tsau | H01L 21/823842 257/368 |
| 2013/0049141 A1 | 2/2013 | Cheng | H01L 29/4966 257/412 |
| 2013/0075826 A1* | 3/2013 | Xu | H01L 29/4966 257/369 |
| 2014/0001569 A1 | 1/2014 | Hafez | H01L 29/66545 257/392 |
| 2014/0070320 A1 | 3/2014 | Mukherjee | H01L 21/823456 257/368 |
| 2017/0365679 A1 | 12/2017 | None | |

FOREIGN PATENT DOCUMENTS

| | | |
|---|---|---|
| CN | 102903741 | 1/2013 |
| JP | 2006-086467 A | 3/2006 |
| KR | 10-2004-0059899 A | 7/2004 |
| KR | 10-2005-0047556 A | 5/2005 |
| KR | 10-2007-0002800 A | 1/2007 |
| KR | 10-2009-0058970 A | 6/2009 |
| KR | 10-2012-0035662 A | 4/2012 |

* cited by examiner

METHODS OF FABRICATING SEMICONDUCTOR DEVICES USING MOS TRANSISTORS WITH NONUNIFORM GATE ELECTRODE STRUCTURES

CROSS-REFERENCE TO RELATED APPLICATION

This application is a divisional application of U.S. patent application Ser. No. 14/312,109; filed Jun. 23, 2014 which claims priority from Korean Patent Application No. 10-2013-0072504 filed on Jun. 24, 2013 in the Korean Intellectual Property Office, the entire contents of which are hereby incorporated by reference in their entireties.

BACKGROUND

The present inventive subject matter relates to semiconductor devices and methods of fabricating the same and, more particularly, to semiconductor devices using metal oxide semiconductor (MOS) transistors.

As the feature size of metal oxide semiconductor (MOS) transistors has been reduced, the length of a gate and the length of a channel formed therebelow are also gradually decreasing. Accordingly, various studies are under way to increase capacitance between the gate and the channel and to improve operating characteristics of the MOS transistors.

SUMMARY

According to some embodiments of the inventive subject matter, a semiconductor device includes a substrate and first and second gate electrodes on the substrate. The first gate electrode includes a first gate insulation film having a bottom portion on the substrate and sidewall portions extending from the bottom portion and away from the substrate defining a first trench having a first width and a first functional film filling the first trench. The second gate electrode includes a second gate insulation film having a bottom portion on the substrate and sidewall portions extending from the bottom portion defining a second trench having a second width different from the first width, a second functional film conforming to the second gate insulation film in the second trench and defining a third trench, and a metal region in the third trench. The first width may be less than the second width.

In some embodiments, the first functional film may include a first work function control film conforming to the sidewall and bottom portions of the first gate insulation layer in the first trench and a first barrier film on the first work function control film. The second functional film may include a second work function control film and a second barrier film on the second work function control film. The first barrier film may include titanium nitride (TiN) and the metal region may include tungsten (W). The first functional film may further include a third work function control film and the second functional film may further include a fourth work function control film. The first and second work function control films may be N type and the third and fourth work function control films may be P type.

In some embodiments, the semiconductor device may further include a first fin and a second fin on the substrate. The first and second gate electrodes may be disposed on respective ones of the first and second fins. The first gate electrode and the second gate electrode may have the same height. The first and second gate electrodes may be disposed in cell array and peripheral circuit regions, respectively.

Further embodiments provide methods including forming an interlayer dielectric film on a substrate having a first dummy gate electrode with a first width and a second dummy gate electrode of a second width different than the first width thereon, the interlayer dielectric film covering lateral surfaces of the first and second dummy gate electrodes. First and second trenches are formed by removing the first and second dummy gate electrodes. First and second gate insulation films are formed in the first and second trenches. A first functional film and a second functional film are formed on the first gate insulation film and the second gate insulation film, respectively, the first functional film controlling a work function and filling the first trench and the second functional film controlling a work function and conforming to the second gate insulation film to define a third trench. A metal region is formed on the second functional film in the third trench.

Still further embodiments provide a semiconductor device including a substrate and first and second fin transistors disposed on the substrate. The first fin transistor includes a first semiconductor fin protruding from the substrate and a first gate electrode crossing the first semiconductor fin. The first gate electrode includes a first gate insulation film having a bottom portion disposed on the substrate and conforming to the first semiconductor fin, and sidewall portions extending from the bottom portion and away from the substrate, at least one first work function control film conforming to the bottom and sidewall portions of the first gate insulation film, and a first barrier film filling a first trench defined by the at least one first work function control film. The first fin transistor further includes first source/drain regions on opposite sides of the first gate electrode.

The second fin transistor includes a second semiconductor fin extending from the substrate and a second gate electrode crossing the second semiconductor fin. The second gate electrode includes a second gate insulation film having a bottom portion disposed on the substrate and conforming to the second semiconductor fin, and sidewall portions extending from the bottom portion and away from the substrate, at least one second work function control film conforming to the bottom and sidewall portions of the first gate insulation film, a second barrier film conforming to the at least one second work function control film, and a metal region filling a trench defined by the at least one second work function control film. The second fin transistor further includes second source/drain regions on opposite sides of the second gate electrode.

BRIEF DESCRIPTION OF THE DRAWINGS

The above and other features and advantages of the present inventive subject matter will become more apparent by describing in detail preferred embodiments thereof with reference to the attached drawings in which.

DETAILED DESCRIPTION

Figure 1:
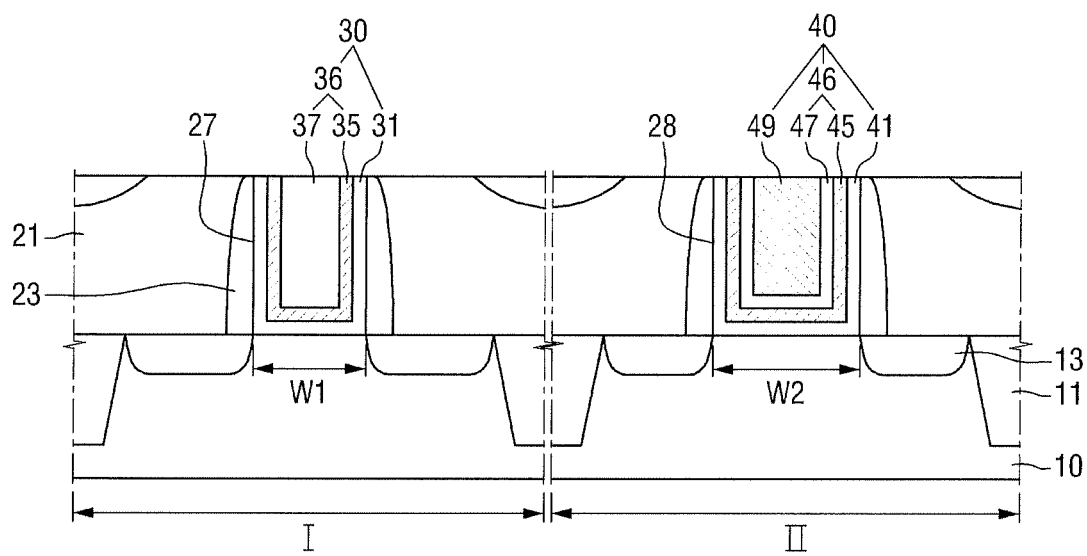
FIG. 1 is a cross-sectional view of a semiconductor device according to some embodiments of the present inventive subject matter.

Advantages and features of the present inventive subject matter and methods of accomplishing the same may be understood more readily by reference to the following detailed description of preferred embodiments and the accompanying drawings. The present inventive subject matter may, however, be embodied in many different forms and should not be construed as being limited to the embodiments set forth herein. Rather, these embodiments are provided so that this disclosure will be thorough and complete and will fully convey the subject matter of the inventive subject matter to those skilled in the art, and the present inventive subject matter will only be defined by the appended claims. Like reference numerals refer to like elements throughout the specification.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive subject matter.

Unless otherwise defined, all terms (including technical and scientific terms) used herein have the same meaning as commonly understood by one of ordinary skill in the art to which the present inventive subject matter belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to some embodiments of the present inventive subject matter will be described with reference to FIG. 1. FIG. 1 is a cross-sectional view of a semiconductor device according to first embodiments of the present inventive subject matter.

Referring to FIG. 1, the semiconductor device according to some embodiments of the present inventive subject matter may include a substrate 10, an interlayer dielectric film 21 including first and second trenches 27 and 28, and first and second gate electrodes 30 and 40 formed in the first and second trenches 27 and 28.

An active region is defined in a substrate 10 by forming an isolation film 11, such as a shallow trench isolation (STI). The substrate 10 may be made of one or more semiconductor materials selected from the group consisting of, for example, Si, Ge, SiGe, GaP, GaAs, SiC, SiGeC, InAs and InP, a silicon on insulator (SOI) substrate, a quartz substrate, a rigid substrate such as a glass substrate for display, or a flexible plastic substrate made of polyimide, polyethylene terephthalate (PET), polyethylene naphthalate (PEN), polymethyl methacrylate (PMMA), polycarbonate (PC), polyether sulfone (PES), or polyester.

A first region I and a second region II are defined in the substrate 10. The first and second regions I and II may be separated from each other or may be connected to each other. For example, the first region I may be a region where a transistor having a low threshold voltage and a fast switching speed is formed, and the second region II may be a region where a transistor having a high threshold voltage, slow switching speed and high reliability is formed. For example, the first region I may be a cell array region where a cell array having unit memory cells are arrayed in a matrix, and the second region II may be a core/peripheral region including peripheral circuits for fetching external data to the cell array or transferring data of the cell array to an external circuit, but embodiments of the present inventive subject matter are not limited thereto.

For example, the first region I may be an SRAM region and the second region II may be a logic region, but embodiments of the present inventive subject matter are not limited thereto. The second region II may be a logic region and the first region I may be another memory region (e.g., DRAM, MRAM, RRAM or PRAM).

The interlayer dielectric film 21 is formed on the substrate 10 and may include first and second trenches 27 and 28. The first trench 27 is formed on the first region I and the second trench 28 is formed on the second region II. A first width W1 of the first trench 27 may be different from a second width W2 of the second trench 28. In detail, the first width W1 of the first trench 27 may be smaller than the second width W2 of the second trench 28. Since the first and second trenches 27 and 28 have different widths, the first gate 30 and the second gate 40 formed in the first and second trenches 27 and 28 may also have different widths.

The interlayer dielectric film 21 may be formed by stacking insulation films of two or more layers. As shown, spacers 23 may be formed on sidewalls of the first and second trenches 27 and 28, and the substrate 10 may be disposed on bottom surfaces of the first and second trenches 27 and 28, but embodiments of the present inventive subject matter are not limited thereto. The spacers 23 may include at least one of a nitride film and an oxynitride film. Unlike in the illustrated embodiments, the spacer 23 may be L-shaped. In the illustrated embodiments, the spacers 23 are formed of a single layer, but embodiments of the present inventive subject matter are not limited thereto. Rather, the spacers 23 may be formed of multiple layers.

A source/drain 13 may be formed in the substrate 10 of at least one side of the first and second gate electrodes 30 and 40.

The first gate electrode 30 may be formed in the first trench 27 and the second gate electrode 40 may be formed in the second trench 28. The first and second gate electrodes 30 and 40 may include first and second gate insulation films 31 and 41, and first and second functional films 36 and 46. The second gate 40 may additionally include a gate metal 49.

The first gate electrode 30 and the second gate electrode 40 have the same height. However, since the first width W1 of the first trench 27 is less than the second width W2 of the second trench 28, the first width W1 of the first gate electrode 30 formed in the first trench 27 on the first region I is less than the second width W2 of the second gate electrode 40 formed in the second trench 28 on the second region II. Therefore, a length W of a channel region under the first gate electrode 30 may be smaller than a length W2 of a channel region under the second gate electrode 40, and a threshold voltage of the first gate electrode 30 may be smaller than a threshold voltage of the second gate electrode 40.

The first gate insulation film 31 may conform to the sidewalls and a bottom surface of the first trench 27 and the second gate insulation film 41 may conform to the sidewalls and a bottom surface of the second trench 28. Since the first and second gate insulation films 31 and 41 are conformal, the first gate insulation film 31 may form a third trench in the first trench 27, the third trench being smaller than in the first trench 27, and the second gate insulation film 41 may form a fourth trench in the second trench 28, the fourth trench being smaller than in the second trench 28.

The first and second gate electrode insulation films 31 and 41 may include a high-k dielectric material having a higher dielectric constant than a silicon oxide film. For example, the first and second gate electrode insulation films 31 and 41 may include a material selected from the group consisting of HfSiON, $HfO_2$, $ZrO_2$, $Ta_2O_5$, $TiO_2$, $SrTiO_5$ and $(Ba,Sr)TiO_5$. The first and second gate electrode insulation films 31 and 41 may be formed to appropriate thicknesses according to the kind of a target device to be formed.

The first and second functional films 36 and 46 may be formed on the first and second gate insulation films 31 and 41, respectively. In detail, the first functional film 36 may be formed on the first gate insulation film 31 in the first trench 27 to fill the third trench. The second functional film 46 may be formed on the second gate insulation film 41 in the second trench 28 conform to the sidewalls and a bottom surface of the second trench 28. Since the functional film 46 is conformal, it may form a fifth trench in the second trench 28, the fifth trench being smaller than the fourth trench. The first and second functional films 36 and 46 may control work functions of the first and second gate electrodes 30 and 40 and may determine whether the transistor functions as an N type transistor or a P type transistor.

The first functional film 36 may include a first work function control film 35 and a first barrier metal film 37 and the second functional film 46 may include a second work function control film 45 and a second barrier metal film 47.

The first work function control film 35 may be formed on the first gate insulation film 31 in the first trench 27 and may conform to the sidewalls and a bottom surface of the first trench 27. The first barrier metal film 37 may be formed on the first work function control film 35. In detail, the first barrier metal film 37 may be formed to fill an empty space of the third trench. Therefore, no further film is formed in the first trench 27. The first work function control film 35 may control a work function of the first gate electrode 30, and the first barrier metal film 37 may protect the first work function control film 35.

The second work function control film 45 may be formed on the second gate insulation film 41 in the second trench 28 and may conform to the sidewalls and a bottom surface of the second trench 28.

The second barrier metal film 47 may be formed on the second work function control film 45 conform to the sidewalls and a bottom surface of the second trench 28. Since the second work function control film 45 and the second barrier metal film 47 are both conformal, the second functional film 46 may form the fifth trench.

The second work function control film 45 may control a work function of the second gate electrode 40. The second barrier metal film 47 may protect the second work function control film 45 and may prevent the gate metal 49 from affecting the second work function control film 47.

The first and second work function control films 35 and 45 may be N type or P type work function control films. When the first and second work function control films 35 and 45 are of N type, they may include, for example, a material selected from the group consisting of TiAl, TiAlN, TaC, TiC, and HfSi.

When the first and second work function control films 35 and 45 are of P type, they may include, for example, a material selected from the group consisting of Mo, Pd, Ru, Pt, TiN, WN, TaN, Ir, TaC, RuN and MoN.

The first and second barrier metal films 37 and 47 may include, for example, TiN.

The gate metal 49 may be formed on the second barrier metal film 47. In detail, the gate metal 49 may be formed on the second barrier metal film 47 to fill the fifth trench in the second trench 28. The gate metal 49 may include, for example, a material selected from the group consisting of aluminum (Al), tungsten (W), metal carbide, metal nitride, metal silicide, metal Al carbide, metal Al nitride, metal Al, and metal Si nitride, but embodiments of the present inventive subject matter are not limited thereto.

The first gate electrode 30 may not include a gate metal.

Figure 2:
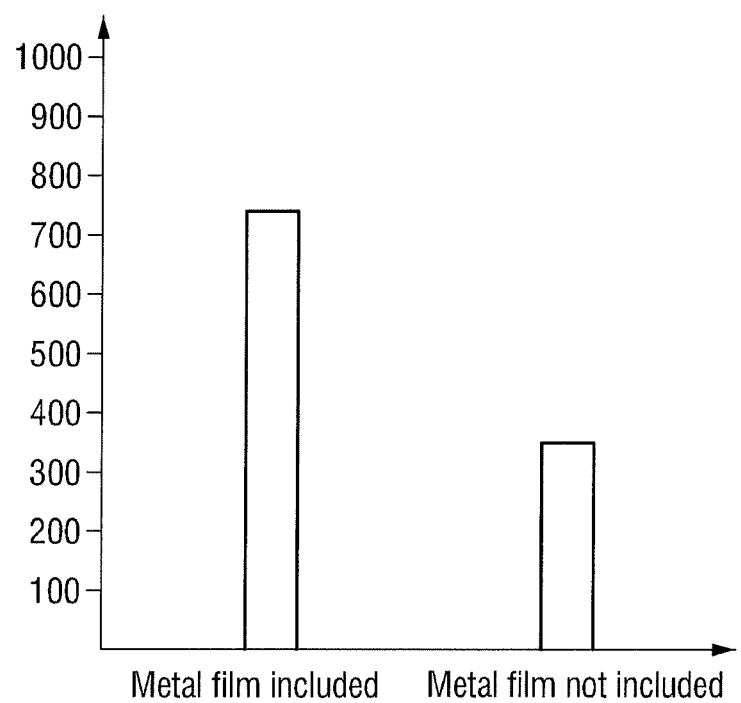
FIG. 2 is a graph illustrating the resistivity of a section of a first gate electrode when the first gate electrode of a first region I includes a gate metal and when the first gate electrode of the first region I does not include the gate metal.
Figure 3:
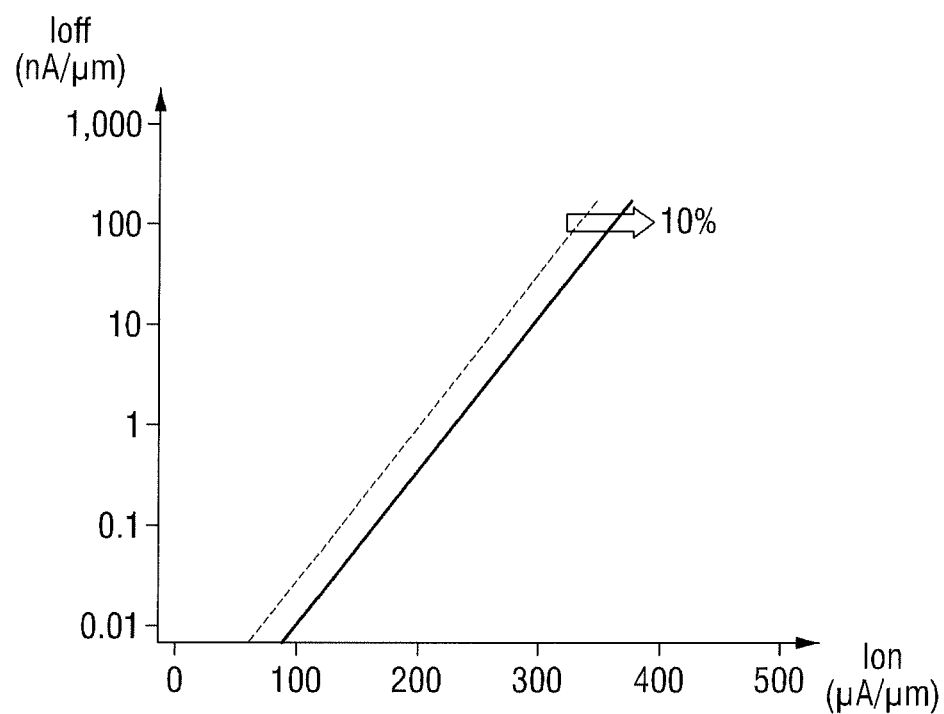
FIG. 3 is a graph illustrating characteristics of a first gate electrode depending on whether the first gate electrode includes a gate metal or not.

Hereinafter, characteristics of some embodiments of the present inventive subject matter will be described with reference to FIGS. 1 to 3. FIGS. 2 and 3 illustrate characteristics of some embodiments of the present inventive subject matter.

In the present inventive subject matter, the first gate electrode 30 formed on the first region I does not include the gate metal 49. Only the second gate electrode 40 formed on the second region II includes the gate metal 49.

The gate metal 49 is made of a low resistivity material and may reduce the resistivity of a gate. However, if a length of a channel region is short, like the first region I shown in FIG. 1, and if the gate metal is formed on the first functional film 36, like the second region II, the resistivity of the first gate electrode 30 is further increased.

FIG. 2 is a graph illustrating the resistivity of a section of the first gate electrode 30 when the first gate electrode 30 of the first region I includes the gate metal and when the first gate electrode 30 of the first region I does not include the gate metal.

Referring to FIG. 2, in a case when the first gate electrode 30 does not include the gate metal, surface resistivity of the first gate electrode 30 is reduced by more than approximately 50%, compared to a case when the first gate electrode 30 of the first region I includes the gate metal. The gate metal may include W.

Table 1 shows resistivity values of metal materials TiN and W. Generally, TiN may be used as a barrier metal film and W may be used as a gate metal.

TABLE 1

| Metal | Resistivity (Ωcm) | Thickness (Å) |
|---|---|---|
| TiN | $2.0 \times 10^4$ | 50 |
| W | $3.3 \times 10^4$ | |

Referring to Table 1, when the first gate electrode 30 has a small thickness, the resistivity of TiN is further reduced. Therefore, if the first width W1 of the first gate electrode 30 is small, like the first region I, and a gate metal is not formed in the first gate electrode 30, the resistivity of the first gate electrode 30 is further reduced. On the other hand, when a width of a gate is large, like the second width W2 of the second gate electrode 40 of the second region II, that is, when the second trench 28 should be filled with a large amount of the gate metal 49, and the second gate electrode 40 does not include the gate metal (e.g., W) 49, the resistivity of the second gate electrode 40 is increased. Therefore, the resistivity of the second gate electrode 40 can be reduced by forming the gate metal 49 to fill the fifth trench.

Additionally, if the first gate electrode 30 of the first region I does not include a gate metal, the performance of a transistor can be improved when the first gate electrode 30 is an N type transistor. Table 2 shows stress values of metal materials.

TABLE 2

| Metal | Stress (Gpa) | Thickness (Å) |
|---|---|---|
| W | 1.54~2.56 | 500 |
| TiN | 0.5 | 50 |
| TaN | 0.2 | 15 |
| TiAl | −0.7 | 100 |

Referring to Table 2, tungsten (W) that is mainly used as a gate metal has stress greater than TiN, TaN o, TiAl, which may be included in the first functional film 36. Accordingly, if the first gate electrode 30 is an N type transistor and a gate metal is formed in the first gate electrode 30, the gate metal may apply stress to a channel region, thereby adversely affecting the performance of transistor.

FIG. 3 is a graph illustrating characteristics of the first gate electrode 30 depending on whether the first gate electrode 30 includes a gate metal or not. In FIG. 3, the y axis indicates the current Ioff flowing in a source when a gate is OFF, and the x axis indicates the current Ion flowing in a source when a gate is ON. The dotted line is graphical representation in a case where the first gate electrode 30 includes a gate metal (made of W) and the solid line is graphical representation in a case where the first gate electrode 30 does not include a gate metal. As shown in FIG. 3, when the first gate electrode 30 does not include a gate metal, the Ion level is increased approximately 10% for the same Ioff level. Therefore, if the first gate electrode 30 does not include a gate metal, the performance is improved by approximately 10%.

Figure 4:
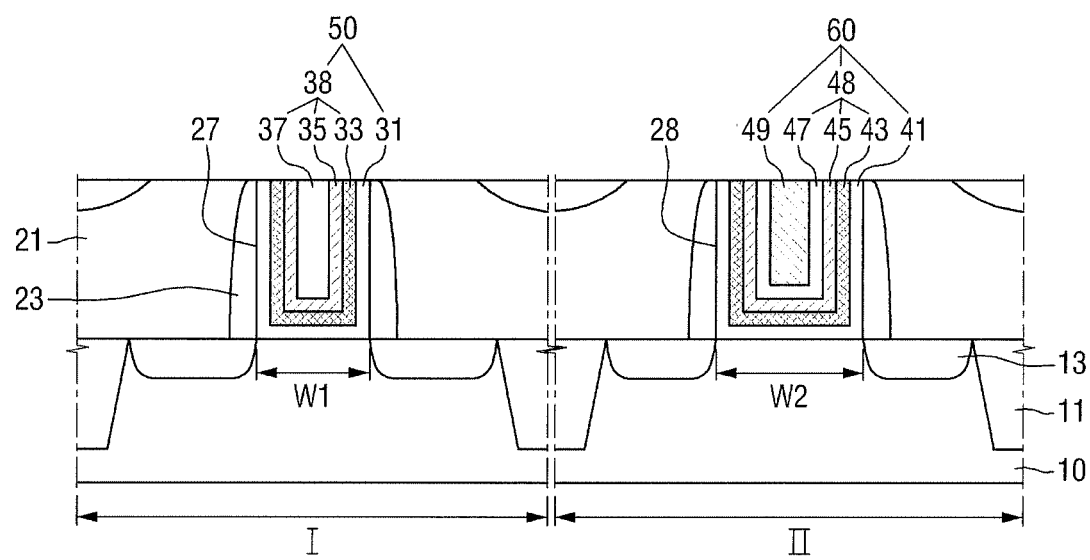
FIG. 4 is a cross-sectional view of a semiconductor device according to further embodiments of the present inventive subject matter.

Hereinafter, a semiconductor device according to further embodiments of the present inventive subject matter will be described with reference to FIG. 4. FIG. 4 is a cross-sectional view of a semiconductor device according to further embodiments of the present inventive subject matter. The same content as that of the semiconductor device 1 of the previously described embodiments will be omitted and the following description will focus on differences between the semiconductor devices according to the present and previously described embodiments.

Referring to FIG. 4, unlike in the semiconductor device 1 shown in FIG. 1, in the semiconductor device 2 according to further embodiments of the present inventive subject matter, a first functional film 38 may further include a third work function control film 33 and a second functional film 48 may further include a fourth work function control film 43. In detail, the third work function control film 33 may be formed between a first gate insulation film 31 and a first work function control film 35 in a first trench 27. The third work function control film 33 may conform to sidewalls and a bottom surface of the first trench 27. The fourth work function control film 43 may be formed between a second gate insulation film 41 and a second work function control film 45 in a second trench 28. The fourth work function control film 43 may conform to sidewalls and a bottom surface of the second trench 28.

The first and second work function control films 35 and 45 may be N type work function control films, and the third and fourth work function control films 33 and 43 may be P type work function control films.

Even if the first work function control film 35 is formed on the third work function control film 33 and the second work function control film 45 is formed on the fourth work function control film 43, it is the third and fourth work function control films 33 and 43 that affect operating characteristics of transistor. The first and second work function control films 35 and 45 may not affect operating characteristics of transistor. Therefore, the semiconductor device 2 according to further embodiments of the present inventive subject matter may be a P type transistor.

Figure 5:
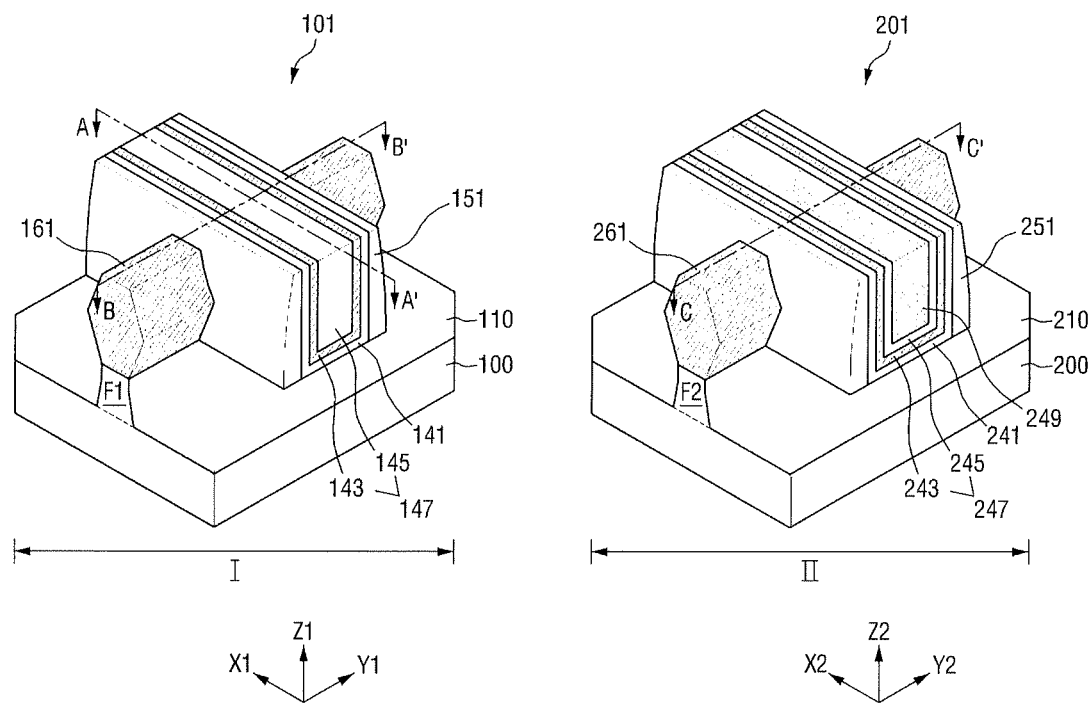
FIG. 5 is a cross-sectional view of a semiconductor device according to still further embodiments of the present inventive subject matter.

Hereinafter, a semiconductor device according to still further embodiments of the present inventive subject matter will be described with reference to FIGS. 5 to 7. FIG. 5 is a cross-sectional view of a semiconductor device according to still further embodiments of the present inventive subject matter, FIG. 6 is a cross-sectional view taken along the line A-A' of FIG. 5, and FIG. 7 is a cross-sectional view taken along the lines B-B' and C-C of FIG. 5.

Figure 6:
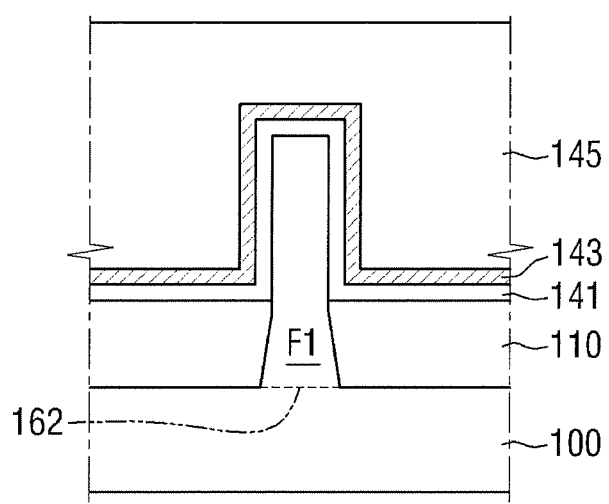
FIG. 6 is a cross-sectional view taken along the line A-A' of FIG. 5.
Figure 7:
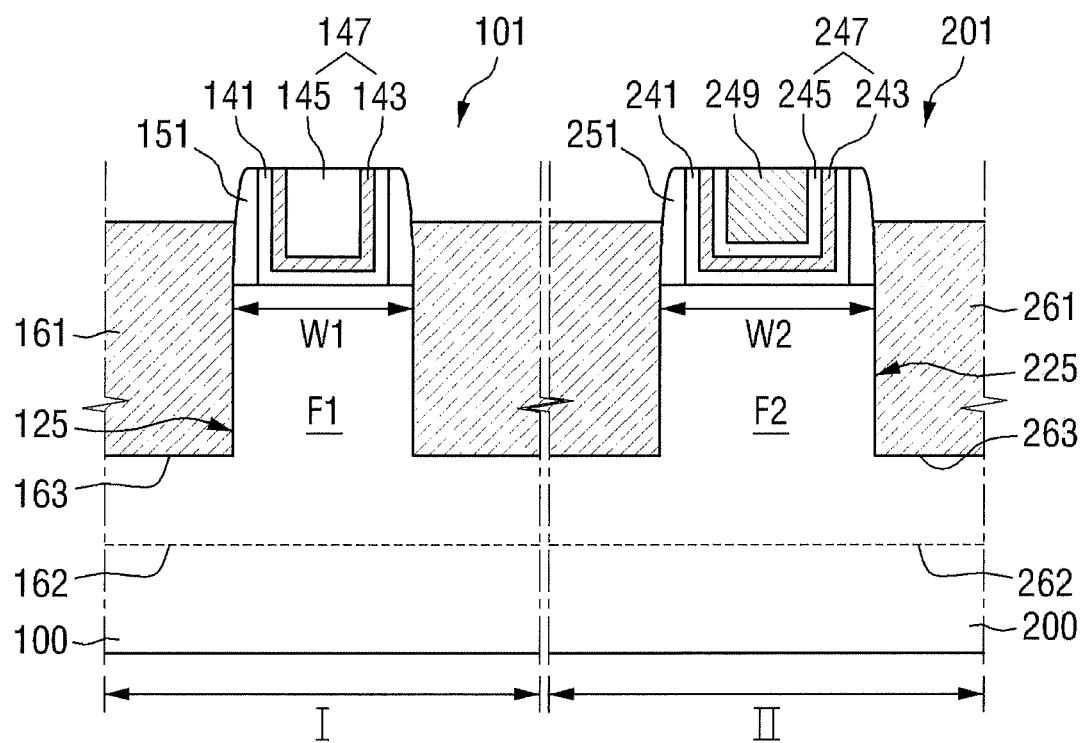
FIG. 7 is a cross-sectional view taken along the lines B-B' and C-C of FIG. 5.

Referring to FIGS. 5 to 7, a first fin type transistor 101 is formed on a first region I and a second fin type transistor 201 is formed on a second region II. The first and second regions I and II may be separated from each other or may be connected to each other. The first region I may be a region where a transistor having a low threshold voltage and a fast switching speed is formed, and the second region II may be a region where a transistor having a high threshold voltage, slow switching speed and high reliability is formed. For example, the first region I may be a cell array region having an array of unit memory cells, and the second region II may be a core/peripheral region including peripheral circuits for fetching external data to the cell array or transferring data of the cell array to an external circuit, but embodiments of the present inventive subject matter are not limited thereto.

The first fin type transistor 101 may include a first fin F1, a first gate insulation film 141 forming a first gate electrode, a first functional film 147, a first recess 125, and a first source/drain 161.

The first fin F1 may extend lengthwise in a second direction Y1. The first fin F1 may be a portion of a substrate 100 and may include an epitaxial layer grown from the substrate 101. An isolation film 110 may cover lateral surfaces of the first fin F1.

A first functional film 147 may be formed on the first fin F1 so as to cross the first fin F1. The first functional film 147 may extend lengthwise in a first direction X1.

The first functional film 147 may include a first work function control film 143 and a first barrier metal film 145. As shown, the first functional film 147 may include the first work function control film 143 and the first barrier metal film 145 sequentially stacked. The first work function control film 143 may control a work function of the first fin type transistor 101 and the first barrier metal film 145 may fill an empty space formed by the first work function control film 143. The first work function control film 143 may include, for example, at least one of TaN, TiC, and TaC. The first barrier metal film 145 may include, for example, TiN. The first functional film 147 may include Si or SiGe, rather than a metal. The first functional film 147 may be formed by, for example, a replacement process (that is, the first functional film 147 may have a gate last structure.).

The first gate insulation film 141 may be formed between the first fin F1 and the first functional film 147. As shown in FIG. 6, the first gate insulation film 141 may be formed on a top surface and upper portions of lateral surfaces of the first fin F1. The first gate insulation film 141 may be disposed between the first functional film 147 and the isolation film 110. The first gate insulation film 141 may include a high-k dielectric material having a higher dielectric constant than a silicon oxide film. For example, the first gate insulation film 141 may include a material selected from the group consisting of HfO2, $ZrO_2$ and $Ta_2O_5$.

A first recess 125 may be formed in the first fin F1 at opposite sides of the first functional film 147.

A first source/drain 161 is formed in the first recess 125. The first source/drain 161 may be an elevated source/drain. The first source/drain 161 and the first functional film 147 may be insulated from each other by a spacer 151.

When the first fin type transistor 101 is a PMOS transistor, the first source/drain 161 may include a compressive stress material. For example, the compressive stress material may be a material having a larger lattice constant than silicon (Si), for example, SiGe. The compressive stress material may improve the mobility of carriers of a channel region by applying compressive stress to the first fin F1.

However, when the first fin type transistor 101 is an NMOS transistor, the first source/drain 161 may include the same material as the substrate 100 or a tensile stress material. For example, when the substrate 100 includes Si, the first source/drain 161 may include Si or a material having a smaller lattice constant than Si (e.g., SiC).

The spacer 151 may include at least one of a nitride film and an oxynitride film.

The substrate 100 may include, for example, one or more semiconductor materials selected from the group consisting of Si, Ge, SiGe, GaP, GaAs, SiC, SiGeC, InAs and InP. In some embodiments, the substrate 100 may be a silicon on insulator (SOI) substrate.

The second fin type transistor 201 may include a second fin F2, a second functional film 247 forming a second gate electrode, a second gate insulation film 241, a gate metal 249, a second recess 225, and a second source/drain 261. The second functional film 247 may be formed on the second fin F2 to cross the second fin F2, the second recess 225 may be formed in the second fin F2 at opposite sides of the second functional film 247, and the second source/drain 261 may be formed in the second recess 225. The second fin type transistor 201 is generally similar to the first fin type transistor 101 and the following description will focus on differences between the first fin type transistor 101 and the second fin type transistor 201.

In FIG. 5, for the sake of convenient explanation, the first fin F1 and the second fin F2 extend lengthwise to be parallel to each other along second directions Y1 and Y2, respectively, but embodiments of the present inventive subject matter are not limited thereto. For example, the first fin F1 may extend lengthwise in the second direction Y1 and the second fin F2 may extend lengthwise in a first direction X2.

Similarly, in FIG. 5, the first functional film 147 and the second functional film 247 extend lengthwise to be parallel to each other along first directions X1 and X2, respectively, but embodiments of the present inventive subject matter are not limited thereto. For example, the first functional film 147 may extend lengthwise in the first direction X1 and the second fin F2 may extend lengthwise in the second direction Y2.

The first fin type transistor 101 and the second fin type transistor 201 may have the same conductivity type (e.g., P type or N type). In some embodiments, the first fin type transistor 101 may have a first conductivity type (e.g., P type) and the second fin type transistor 201 may have a second conductivity type (e.g., N type).

In the second fin type transistor 201, the second functional film 247 is formed on the second gate insulation film 241. In detail, the second functional film 247 conforms to the inner surface of the second gate insulation film 241 to form a trench therein, unlike the first functional film 147 formed to fill the inside of the first insulation film 141.

The trench formed by the second functional film 247 may be filled with the gate metal 249. The gate metal 249 may include, for example, Al and/or W.

Undefined reference numeral 200 denotes a substrate, undefined reference numeral 210 denotes an isolation film and undefined reference numeral 251 denotes a second spacer.

The first recess 125 and the second recess 225 may be filled with a metal rather than a semiconductor material. The first source/drain 161 and the second source/drain 261 may include a metal material, rather than a semiconductor material such as Si, SiGe or SiC.

Referring to FIG. 7, a first width W1 of the first fin F1 is less than a second width W2 of the second fin F2. Therefore, a channel region of the first fin type transistor 101 is smaller than that of the second fin type transistor 201. Since a gate metal is not formed in the first fin type transistor 101, unlike in the second fin type transistor 201, gate resistivity and performance can be improved.

Operations for fabricating a semiconductor device according to some embodiments of the present inventive subject matter will be described with reference to FIGS. 1 and 8 to 13. FIGS. 8 to 13 illustrate operations for fabricating a semiconductor device according to some embodiments of the present inventive subject matter. Repeated description of components will be omitted.

Figure 8:
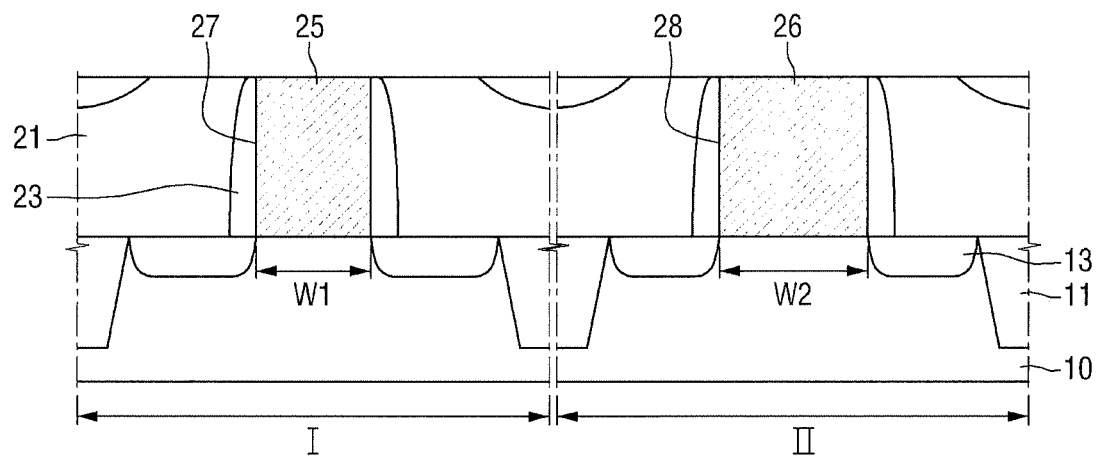
FIGS. 8 to 13 illustrate operations for fabricating a semiconductor device according to some embodiments of the present inventive subject matter.

Referring to FIG. 8, an interlayer dielectric film 21 is formed on a substrate 10. The substrate 10 includes a first region I and a second region II. The first and second regions I and II may be separated from each other or may be connected to each other. An active region is defined in a substrate 10 by forming an isolation film 11, such as a shallow trench isolation (STI). A first dummy gate electrode 25 is disposed on the first region I and a second dummy gate electrode 26 is disposed on the second region II. A first width W1 of the first dummy gate electrode 25 is different from a second width W2 of the second dummy gate electrode 26. In detail, the first width W1 of the first dummy gate electrode 25 is less than the second width W2 of the second dummy gate electrode 26.

The interlayer dielectric film 21 is formed to cover both lateral surfaces of the first and second dummy gates 25 and 26. Therefore, top surfaces of the first and second dummy gate electrodes 25 and 26 are exposed. Spacers 23 are formed on lateral surfaces of the first dummy gate electrode 25 and the second dummy gate electrode 26.

Figure 9:
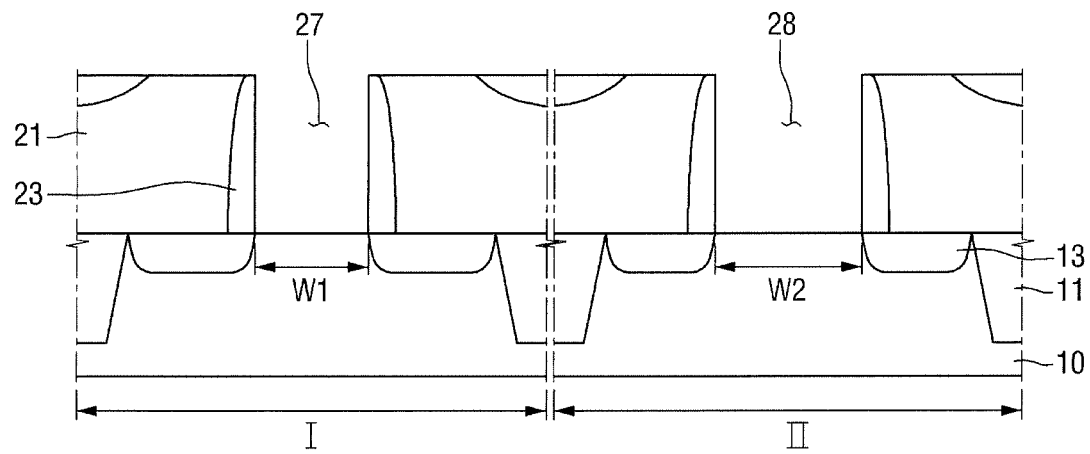

Referring to FIG. 9, first and second trenches 27 and 28 are formed by removing the first and second dummy gate electrodes 25 and 26, respectively. A top surface of the substrate 10 may be exposed within the first and second trenches 27 and 28. Since the first and second dummy gate electrodes 25 and 26 have different widths, the first and second trenches 27 and 28 may also have different widths.

Figure 10:
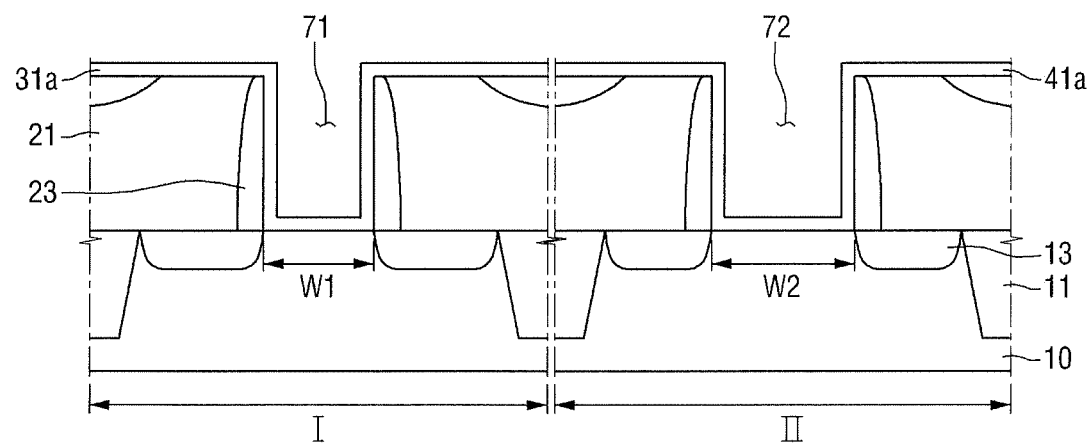

Referring to FIG. 10, first and second gate insulation films 31a and 41a are formed on the substrate 10. In detail, the first gate insulation film 31a is formed on the first region I and the second gate insulation film 41a is formed on the second region II. The first gate insulation film 31a may conform to a top surface of the interlayer dielectric film 21 and sidewalls and a bottom surface of the first trench 27. Therefore, a third trench 71 smaller than the first trench 27 is formed in the first trench 27. The second gate insulation film 41a may conform to a top surface of the interlayer dielectric film 21 and sidewalls and a bottom surface of the second trench 28. Therefore, a fourth trench 72 smaller than the second trench 28 is formed in the second trench 28.

A first functional film 36a is formed on the first gate insulation film 31a and a second functional film 46a is formed on the second gate insulation film 41a. The first and second functional films 36a and 46a may control a work function of a transistor. The first functional film 36a is formed to fill the third trench 71 and the second functional film 46a includes a fifth trench 73 in the fourth trench 72.

Figure 11:
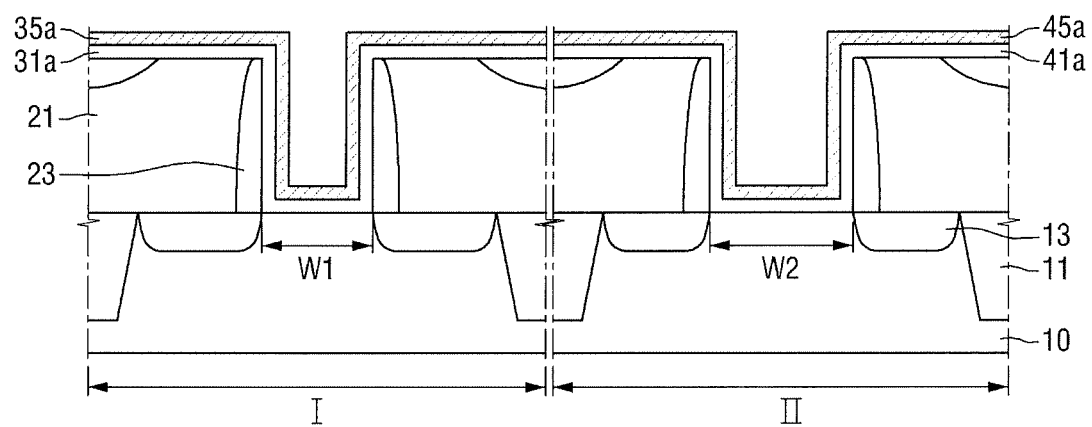

In detail, referring to FIG. 11, a first work function control film 35a is formed on the first region I and a second work function control film 45a is formed on the second region II. The first work function control film 35a is formed on the first gate insulation film 31a and is conformal along the sidewalls and a bottom surface of the third trench 71. The second work function control film 45a is formed on the second gate insulation film 41a and is conformal along the sidewalls and a bottom surface of the fourth trench 72.

Figure 12:
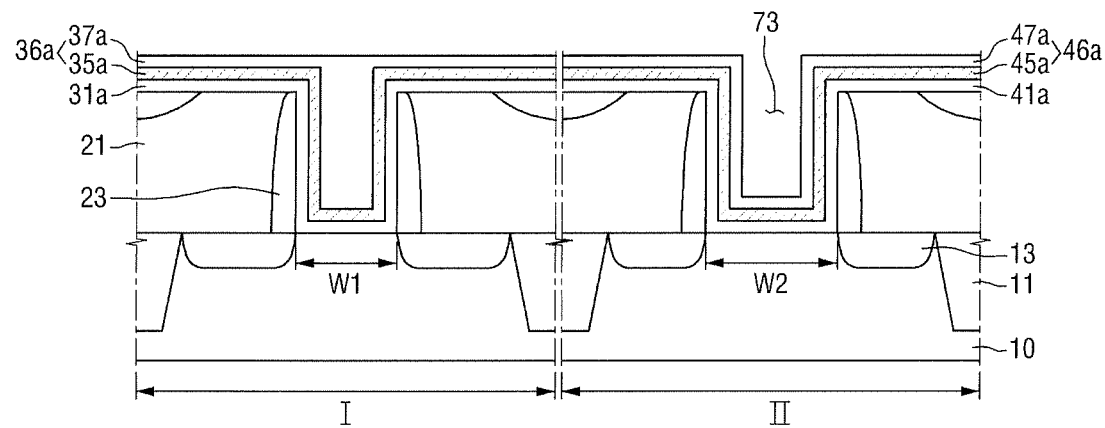

Referring to FIG. 12, a first barrier metal film 37a is formed on the first work function control film 35a and a second barrier metal film 47a is formed on the second work function control film 45a. Since the first barrier metal film 37a is formed to fill the third trench 71, no further film is formed in the third trench 71. The second barrier metal film 47a is conformal along the sidewalls and a bottom surface of the fourth trench 72. Therefore, a fifth trench 73 smaller than the fourth trench 72 may be formed in the fourth trench 72.

Figure 13:
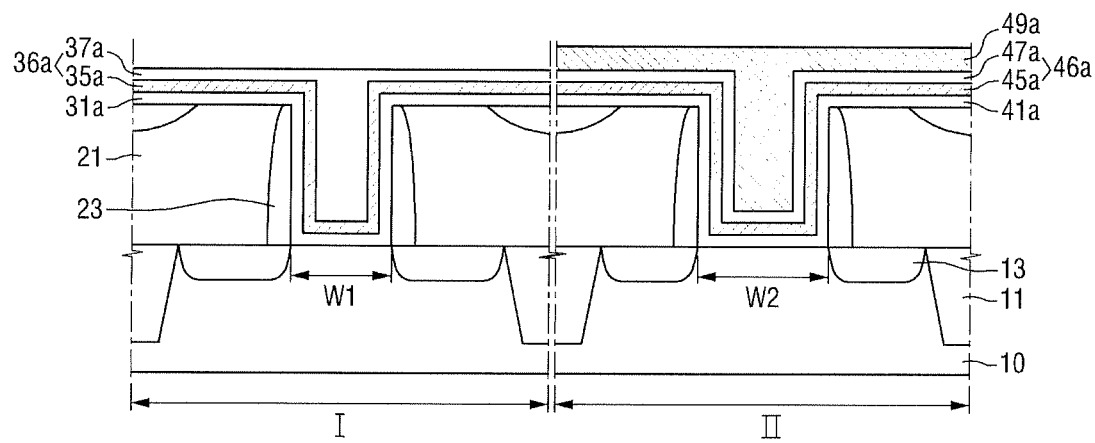

Referring to FIG. 13, a gate metal 49a is formed on the second functional film 46a. In detail, the gate metal 49a may be formed to fill the fifth trench 73.

In FIG. 13, the gate metal 49a is not stacked on the first region I. However, when the gate metal 49a is formed on the second region II, it may also be formed on the first functional film 36a. Polishing may be performed to expose the top surface of the interlayer dielectric film 21, thereby producing the semiconductor device 1 shown in FIG. 1.

When the gate metal 49a is formed on the second functional film 46a, it may also be stacked on the first functional film 36a but may not remain on the first region I as the result of polishing.

Since the first and second dummy gate electrodes 25 and 26 have different widths, a length W1 of a channel region of the first region I may be smaller than a length W2 of a channel region of the second region II. However, only the lengths of the channel regions of the first region I and the second region II are different from each other and the heights of the first and second gate electrodes 30 and 40 may be equal to each other. A height ranging from the top surface of the substrate 10 to a top surface of the first barrier metal film 37 and a height ranging from the top surface of the substrate 10 to a top surface of the gate metal 49 may be equal.

Operations for fabricating a semiconductor device according to further embodiments of the present inventive subject matter will be described with reference to FIGS. 2, 8 to 10 and 14 to 16. Repeated description of like components with respect to the previously described embodiments will be omitted and the following description will focus on differences between the methods for fabricating the semiconductor devices according to the present and previously described embodiments.

Figure 14:
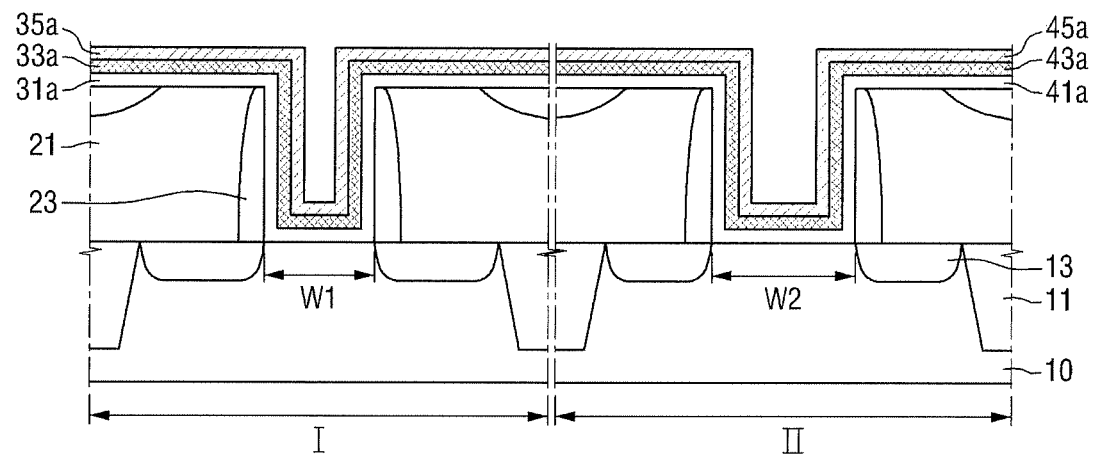
FIGS. 14 to 16 illustrate operations for fabricating a semiconductor device according to further embodiments of the present inventive subject matter.
Figure 15:
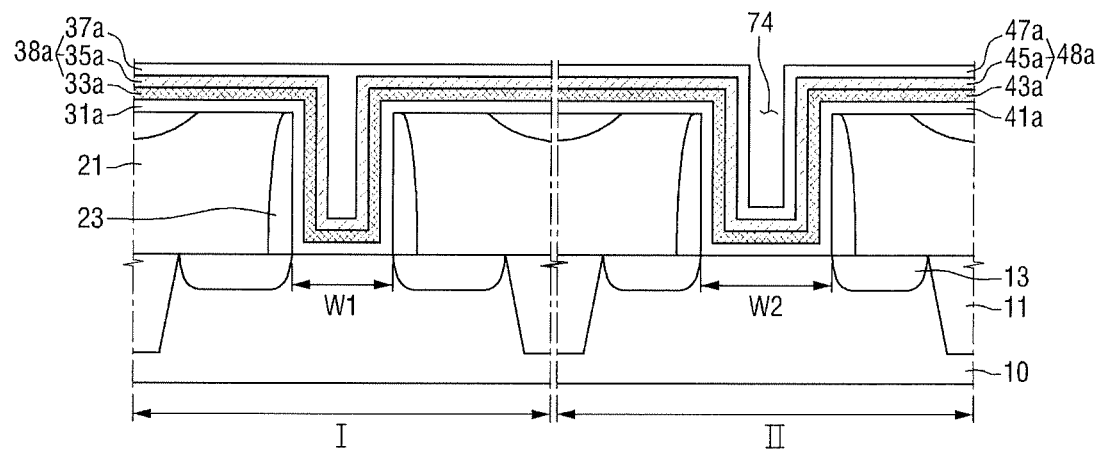
Figure 16:
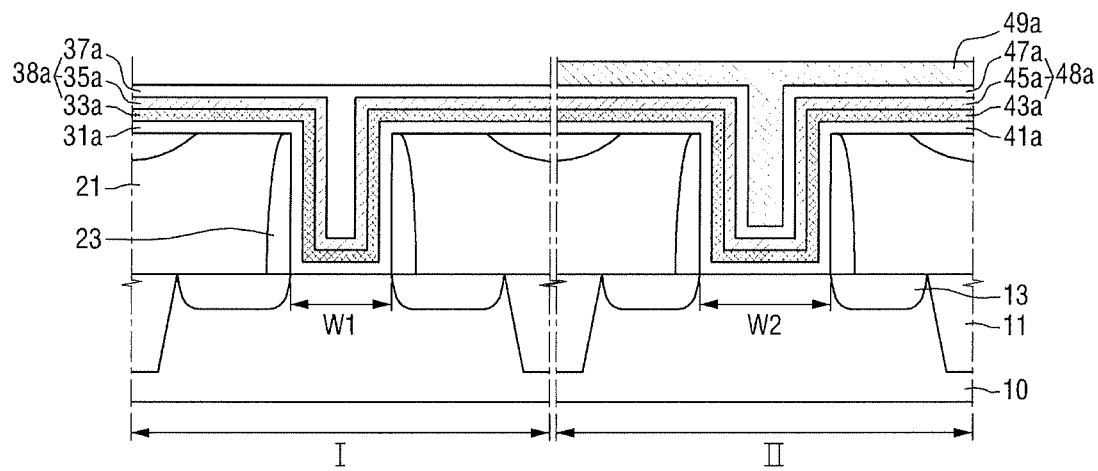

FIGS. 14 to 16 illustrate operations for fabricating a semiconductor device according to further embodiments of the present inventive subject matter. Operations described above with reference to FIGS. 8 to 10 are performed. The first functional film 38a is formed to fill the third trench 71 and the second functional film 48a is formed to fill the fourth trench 72. Referring to FIG. 14, unlike previously described embodiments, the first functional film 38a further includes a third work function control film 33a and the second functional film 48a further includes a fourth work function control film 43a. In detail, a third work function control film 33a is formed between the first gate insulation film 31a and the first work function control film 35a. The third work function control film 33a may be formed under the first work function control film 35a and may conform to sidewalls and a bottom surface of the third trench 71.

A fourth work function control film 43a is formed between the second gate insulation film 41a and the second work function control film 45a. The fourth work function control film 43a may be formed under the second work function control film 45a and may conform to sidewalls and a bottom surface of the fourth trench 72. As described above, the first and second work function control films 35a and 45a may be N type work function control films and the third and fourth work function control films 33a and 43a may be P type work function control films to provide a P type transistor.

Referring to FIG. 15, a first barrier metal film 37a is formed on the first work function control film 35a to fill the third trench 71 and a second barrier metal film 47a is formed on the second work function control film 45a to have a fifth trench 74 smaller than the fourth trench 72. Referring to FIG. 16, a gate metal 49a is formed on the second barrier metal film 47a to fill the fifth trench 74. The gate metal 49a may also be formed on the first barrier metal film 37a. Polishing may be performed to expose a top surface of the interlayer dielectric film 21 and thereby produce the semiconductor device 2 shown in FIG. 2.

Figure 17:
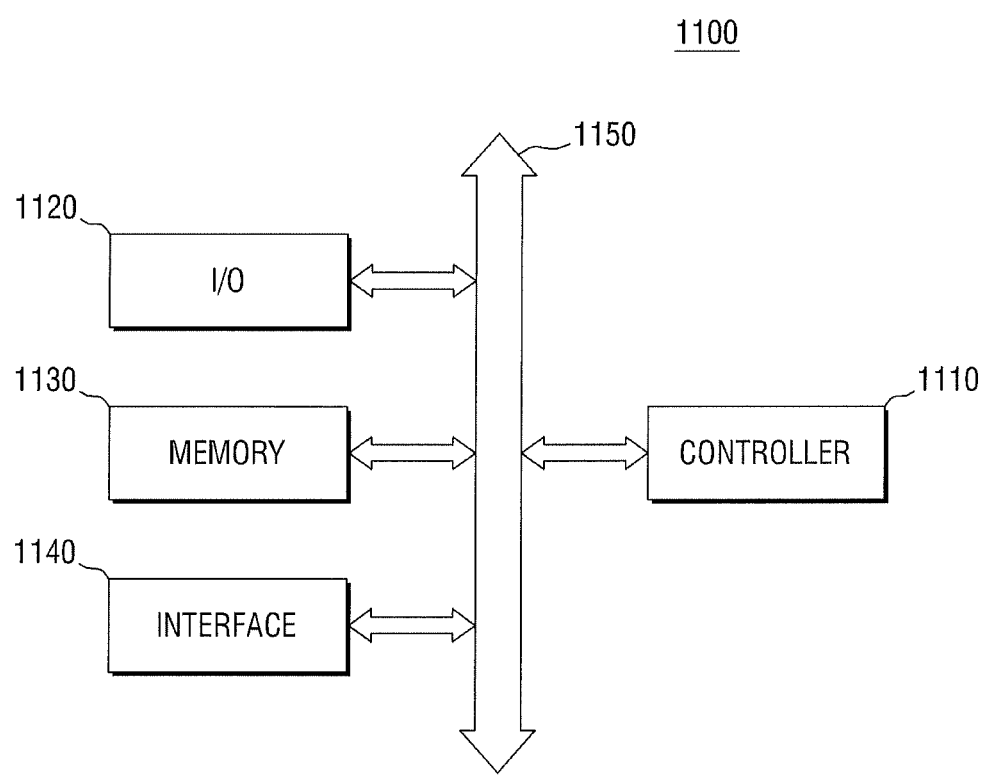
FIG. 17 is a block diagram of an electronic system including a semiconductor device according to some embodiments of the present inventive subject matter.

FIG. 17 is a block diagram of an electronic system including a semiconductor device according to some embodiments of the present inventive subject matter.

Referring to FIG. 17, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as the operating memory for improving the operation of the controller 1110.

The semiconductor devices 1, 2, 101 and 201 according to some embodiments of the present inventive subject matter may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 18:
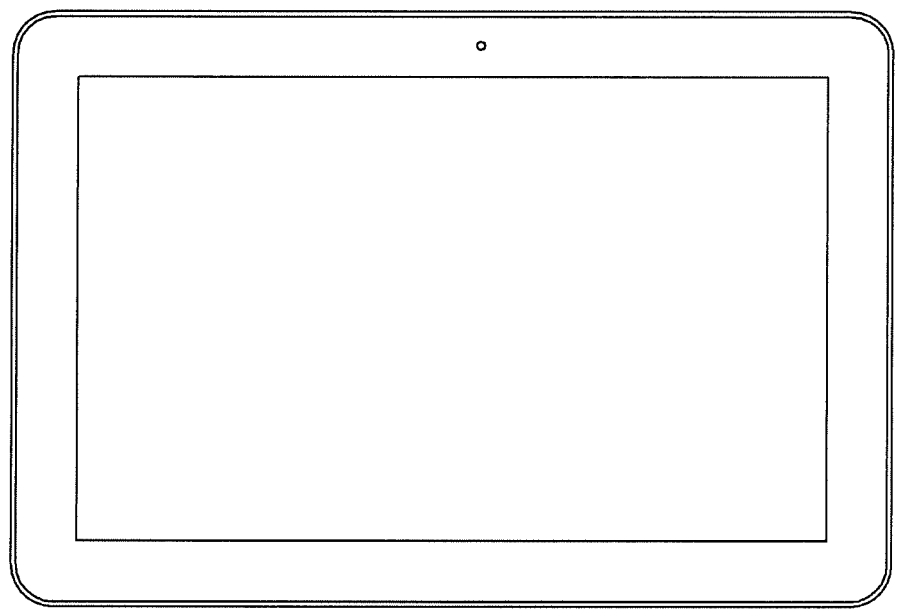
FIGS. 18 and 19 illustrate an exemplary semiconductor system to which semiconductor devices according to some embodiments of the present inventive subject matter can be employed.
Figure 19:
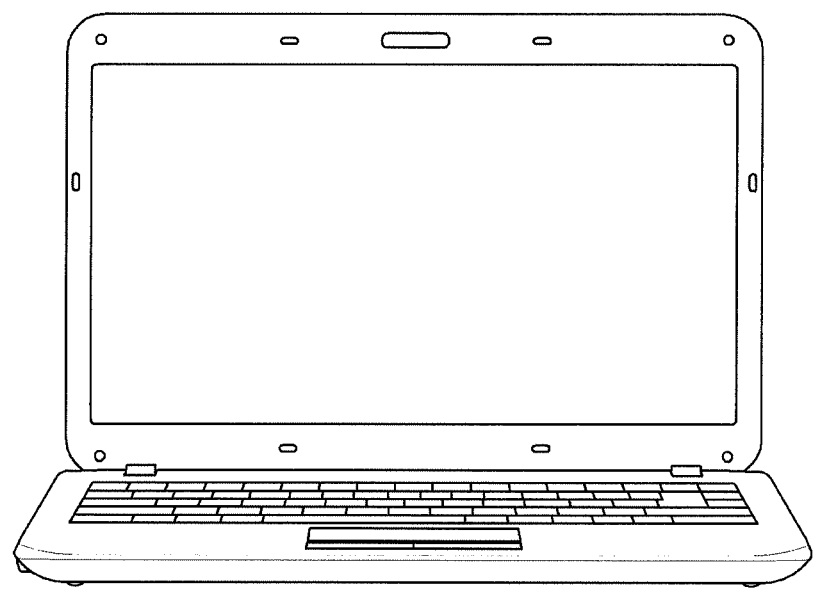

FIGS. 18 and 19 illustrate an exemplary semiconductor system to which semiconductor devices according to some embodiments of the present inventive subject matter can be employed.

FIG. 18 illustrates an example in which a semiconductor device according to some embodiments of the present inventive subject matter is applied to a tablet PC. FIG. 19 illustrates an example in which a semiconductor device according to some embodiments of the present inventive subject matter is applied to a notebook computer. At least one of the semiconductor devices 1, 2, 101 and 201 according to some embodiments of the present inventive subject matter can be employed to a tablet PC, a notebook computer, and the like. It is obvious to one skilled in the art that the semiconductor devices according to some embodiments of the present inventive subject matter may also be applied to other IC devices not illustrated herein.

While the present inventive subject matter has been particularly shown and described with reference to exemplary embodiments thereof, it will be understood by those of ordinary skill in the art that various changes in form and details may be made therein without departing from the spirit and scope of the present inventive subject matter as defined by the following claims. It is therefore desired that the present embodiments be considered in all respects as illustrative and not restrictive, reference being made to the appended claims rather than the foregoing description to indicate the scope of the inventive subject matter.

The foregoing is illustrative of the present inventive subject matter and is not to be construed as limiting thereof. Although a few embodiments of the present inventive subject matter have been described, those skilled in the art will readily appreciate that many modifications are possible in the embodiments without materially departing from the novel teachings and advantages of the present inventive subject matter. Accordingly, all such modifications are intended to be included within the scope of the present inventive subject matter as defined in the claims. Therefore, it is to be understood that the foregoing is illustrative of the present inventive subject matter and is not to be construed as limited to the specific embodiments disclosed, and that modifications to the disclosed embodiments, as well as other embodiments, are intended to be included within the scope of the appended claims. The present inventive subject matter is defined by the following claims, with equivalents of the claims to be included therein.

What is claimed is:
1. A method comprising:
   forming an interlayer dielectric film on a substrate, the substrate having formed thereon a first dummy gate electrode of a first width and a second dummy gate electrode of a second width different than the first width, the interlayer dielectric film covering lateral surfaces of the first and second dummy gate electrodes;
   forming first and second trenches by removing the first and second dummy gate electrodes;

forming third and fourth trenches by conformally forming first and second gate insulation films respectively in the first and second trenches;

forming a first functional film and a second functional film on the first gate insulation film and the second gate insulation film, respectively, the first functional film completely filling the third trench, the second functional film conforming to the second gate insulation film thereby defining a fifth trench; and forming a metal region on the second functional film, the metal region completely filling the fifth trench, wherein forming the first functional film includes forming a first work function film, which is formed along sidewall and bottom portions of the first gate insulation film to define a sixth trench, and a first barrier metal film on the first work function film and completely filling the sixth trench, wherein forming the second functional film includes forming a second work function film, which is formed along sidewall and bottom portions of the second gate insulation film, and a second barrier metal film on the second work function film, wherein the number of layers formed in the first functional film is the same as the number of layers formed in the second functional film, wherein the first work function film and the second work function film are formed simultaneously, wherein the first barrier metal film and the second barrier metal film are formed simultaneously and consist of the same material.

2. The method of claim 1, wherein a distance from a top surface of the substrate to a top surface of the first barrier metal film is the same as a distance from the top surface of the substrate to a top surface of the metal region.

3. The method of claim 1, wherein the first and second barrier metal films comprise TiN.

4. The method of claim 1, wherein the first width is less than the second width.

5. The method of claim 1,
wherein the first functional film further comprises a third work function film, and
wherein the second functional film further comprises a fourth work function film.

6. A method comprising:
forming an interlayer dielectric film on a substrate, the substrate having formed thereon a first dummy gate electrode of a first width and a second dummy gate electrode of a second width different than the first width, the interlayer dielectric film covering lateral surfaces of the first and second dummy gate electrodes;

forming first and second trenches by removing the first and second dummy gate electrodes;

forming third and fourth trenches by conformally forming first and second gate insulation films respectively in the first and second trenches;

forming a first functional film and a second functional film on the first gate insulation film and the second gate insulation film, respectively, the first functional film completely filling the third trench, the second functional film conforming to the second gate insulation film thereby defining a fifth trench; and forming a metal region on the second functional film, the metal region completely filling the fifth trench, wherein forming the first functional film includes forming a first work function film on and contacting sidewall and bottom portions of the first gate insulation film, and forming a first barrier metal film on and contacting the first work function film, wherein forming the second functional film includes forming a second work function film on and contacting sidewall and bottom portions of the second gate insulation film to farm a sixth trench, and forming a second barrier metal film on and contacting the second work function film and completely filling the sixth trench, wherein the first work function film and the second work function film are formed simultaneously, wherein the first barrier metal film and the second harrier metal film are formed simultaneously and consist of the same material.

7. The method of claim 6, wherein a distance from a top surface of the substrate to a top surface of the first barrier metal film is the same as a distance from the top surface of the substrate to a top surface of the metal region.

8. The method of claim 6, wherein the first and second barrier metal films comprise TiN.

9. The method of claim 6, wherein the first width is less than the second width.

10. The method of claim 6, wherein the first functional film further comprises:
a third work function film,
wherein the second functional film further comprises a fourth work function film.

* * * * *